(12) United States Patent
Takahashi et al.

(10) Patent No.: US 9,984,875 B2
(45) Date of Patent: May 29, 2018

(54) FILM FORMING METHOD

(71) Applicant: TOKYO ELECTRON LIMITED, Tokyo (JP)

(72) Inventors: Kazuya Takahashi, Nirasaki (JP); Mitsuhiro Okada, Nirasaki (JP); Katsuhiko Komori, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days. days.

(21) Appl. No.: 15/436,991

(22) Filed: Feb. 20, 2017

(65) Prior Publication Data

US 2017/0243742 A1  Aug. 24, 2017

(30) Foreign Application Priority Data

Feb. 22, 2016 (JP) .................. 2016-030837

(51) Int. Cl.
| | |
|---|---|
| *H01L 21/00* | (2006.01) |
| *C23C 16/24* | (2006.01) |
| *H01L 21/02* | (2006.01) |
| *C23C 16/455* | (2006.01) |

(52) U.S. Cl.
CPC ........ *H01L 21/02647* (2013.01); *C23C 16/24* (2013.01); *C23C 16/455* (2013.01); *H01L 21/0262* (2013.01); *H01L 21/02532* (2013.01)

(58) Field of Classification Search
CPC .......... H01L 21/02647; H01L 21/0262; H01L 21/02532; H01L 21/02381; H01L 21/0245; C23C 16/455; C23C 16/24; C23C 16/0227
See application file for complete search history.

(56) References Cited

U.S. PATENT DOCUMENTS

| | | | | |
|---|---|---|---|---|
| 6,897,129 B2* | 5/2005 | Kondo | ............ | C23C 16/22 |
| | | | | 257/E21.102 |
| 2003/0221611 A1* | 12/2003 | Kondo | ............ | C23C 16/22 |
| | | | | 117/88 |
| 2005/0006686 A1* | 1/2005 | Saida | ............ | H01L 27/10861 |
| | | | | 257/301 |

FOREIGN PATENT DOCUMENTS

| | | |
|---|---|---|
| JP | 63029954 A | 2/1988 |
| JP | 1217956 A | 8/1989 |
| JP | 2015-045082 A | 3/2015 |

* cited by examiner

*Primary Examiner* — Nikolay Yushin
(74) *Attorney, Agent, or Firm* — Nath, Goldberg & Meyer; Jerald L. Meyer

(57) ABSTRACT

A method of forming a silicon film, a germanium film or a silicon germanium film on a target substrate having a fine recess formed on a surface of the target substrate by a chemical vapor deposition method includes placing the target substrate having the fine recess in a processing container, and supplying a film forming gas containing an element constituting a film to be formed and a chlorine-containing compound gas into the processing container. Adsorption of the film forming gas at an upper portion of the fine recess is selectively inhibited by the chlorine-containing compound gas.

8 Claims, 7 Drawing Sheets

FILM FORMING METHOD

CROSS-REFERENCE TO RELATED APPLICATION

This application claims the benefit of Japanese Patent Application No. 2016-030837, filed on Feb. 22, 2016, in the Japan Patent Office, the disclosure of which is incorporated herein in its entirety by reference.

TECHNICAL FIELD

The present disclosure relates to a film forming method of forming a silicon film, a germanium film or a silicon germanium film.

BACKGROUND

In processes of manufacturing semiconductor devices, there is a process of forming an electrode by forming a recess such as a hole or a trench in an insulating film and by embedding a silicon film such as an amorphous silicon film in the recess. In general, a chemical vapor deposition (CVD) method has been employed for a process of forming a silicon film.

However, as miniaturization of a semiconductor device has been progressed in recent years, embedment of a silicon film in a deep hole or a trench by the CVD method results in poor step coverage and thus creation of voids. If voids are created in a silicon film used as an electrode, a resistance value is increased. Therefore, a silicon film with as few voids as possible is required. This requirement is also applied to a germanium film or a silicon germanium film in addition to the silicon film.

On the contrary, there has been proposed a technique of forming a silicon film in a recess such as a hole or a trench, etching the silicon film to have a V-shaped section and then causing silicon to be embedded in the recess again. Accordingly, it is possible to achieve void-free embedment of silicon in the recess.

However, the technique of forming a silicon film in a recess such as a hole or a trench, etching the silicon film to have a V-shaped section and then causing silicon to be embedded in the recess again has problems that productivity is lowered and the process is complicated, resulting in difficulty in managing the film forming process.

SUMMARY

Some embodiments of the present disclosure provide to a film forming method capable of forming a silicon film, a germanium film or a silicon germanium film having no void in a fine recess without causing decrease in productivity or complication of process.

According to one embodiment of the present disclosure, there is provided a method of forming a silicon film, a germanium film or a silicon germanium film on a target substrate having a fine recess formed on a surface of the target substrate by a chemical vapor deposition method, the method including: placing the target substrate having the fine recess in a processing container; and supplying a film forming gas containing an element constituting a film to be formed and a chlorine-containing compound gas into the processing container; wherein adsorption of the film forming gas at an upper portion of the fine recess is selectively inhibited by the chlorine-containing compound gas.

According to another embodiment of the present disclosure, there is provided a method of forming a silicon film on a target substrate having a fine recess formed on a surface of the target substrate by a chemical vapor deposition method, the method including: placing the target substrate having the fine recess in a processing container; and supplying $SiH_4$ gas as a film forming gas and $SiH_2Cl_2$ gas for inhibiting adsorption of $SiH_4$ gas into the processing container; wherein the adsorption of $SiH_4$ gas at an upper portion of the fine recess is selectively inhibited by $SiH_2Cl_2$ gas.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In this embodiment, an amorphous silicon film, a germanium film or a silicon germanium film is formed on a target substrate with a recess formed therein.

<Example of Film Forming Apparatus>

Figure 1:
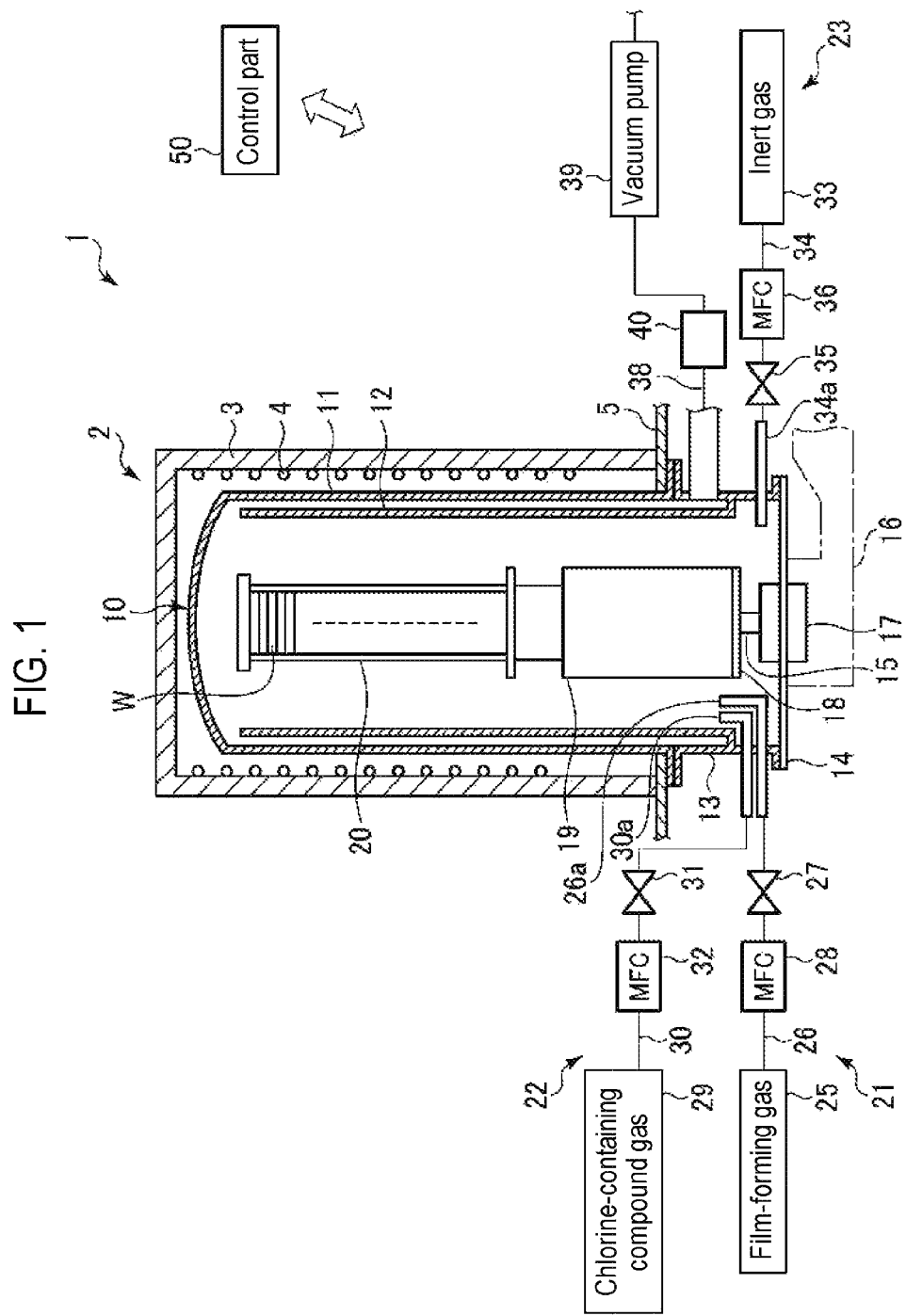
FIG. 1 is a longitudinal sectional view showing one example of a film forming apparatus for performing a film forming method according to the present disclosure.
Figure 2:
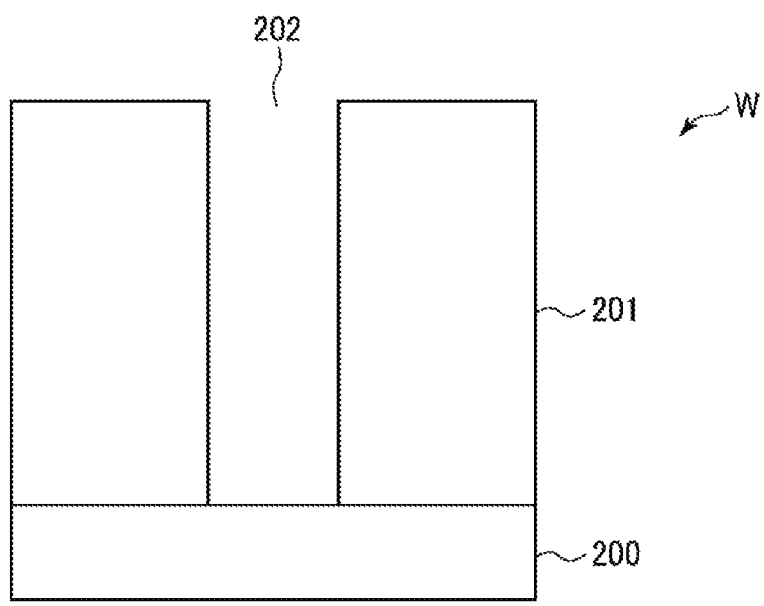
FIG. 2 is a sectional view showing one example of a configuration of a semiconductor wafer used in the film forming method according to the present disclosure.
Figure 3:
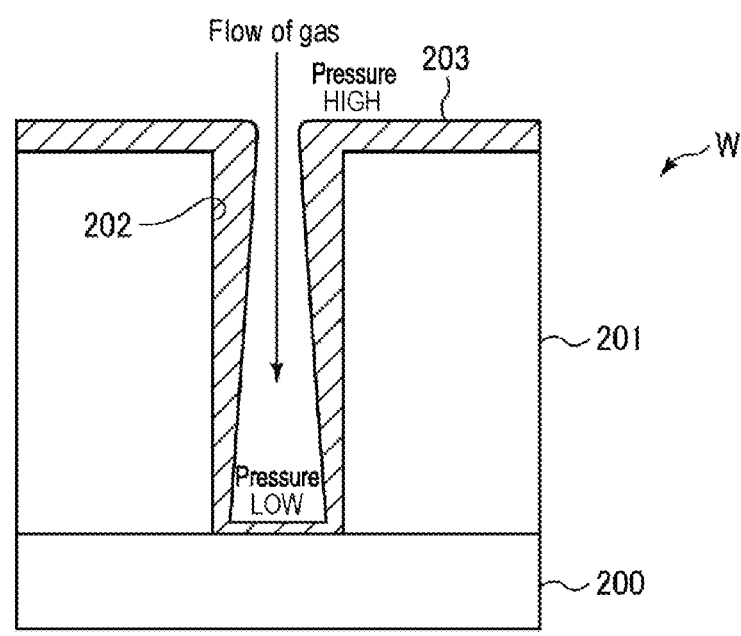
FIG. 3 is a view illustrating a state of a film forming process in a fine recess when an amorphous silicon film is formed by a conventional CVD method using only $SiH_4$ gas.

FIG. 1 is a longitudinal sectional view showing one example of a film forming apparatus for performing a film forming method according to the present disclosure.

A film forming apparatus 1 includes a heating furnace 2 having a cylindrical thermal insulating body 3 provided with a ceiling part and a heater 4 provided on an inner peripheral surface of the thermal insulating body 3. The heating furnace 2 is installed on a base plate 5.

A processing container 10 having a dual tube structure is inserted in the heating furnace 2, wherein the processing container 10 is composed of an outer tube 11 having a closed upper end and made of, for example, quartz and an inner tube 12 concentrically disposed in the outer tube 11 and made of, for example, quartz. In addition, the heater 4 is installed to externally surround the processing container 10.

Lower ends of the outer and inner tubes 11 and 12 are held on a cylindrical manifold 13 made of stainless steel or the like, and a cap part 14 is provided at a lower opening of the manifold 13 such that the cap part can open and close the opening of the manifold to hermetically seal the same.

A rotational shaft 15, which can be rotated in an airtight state by a magnetic seal, is inserted while passing through a central portion of the cap part 14; and a lower end of the rotational shaft 15 is connected to a rotation mechanism 17 of an elevation unit 16 and an upper end of the rotational shaft is secured to a turntable 18. A wafer boat 20 made of quartz and provided for retaining semiconductor wafers (hereinafter, simply referred to as "wafer") as target substrates is mounted on the turntable 18 with a heat insulation tube 19 interposed therebetween. The wafer boat 20 is configured to accommodate, for example, 50 to 150 wafers W stacked at predetermined intervals (pitches).

The wafer boat 20 can be loaded into and unloaded from the processing container 10 by raising and lowering the elevation unit 16 by an elevation mechanism (not shown). When the wafer boat 20 is loaded into the processing container 10, the cap part 14 is brought into close contact with the manifold 13 to hermetically seal a gap therebetween.

In addition, the film forming apparatus 1 includes a film forming gas supplying mechanism 21 for introducing a film forming gas into the processing container 10, a chlorine-containing compound gas supplying mechanism 22 for introducing a chlorine-containing compound gas, which prevents adsorption of the film forming gas, into the processing container 10 and an inert gas supplying mechanism 23 for introducing an inert gas, which is used as a purge gas and the like, into the processing container 10.

The film forming gas supplying mechanism 21 has a film forming gas supplying source 25, a film forming gas pipe 26 for guiding the film forming gas from the film forming gas supplying source 25, and a film forming gas nozzle 26a that is made of quartz, connected to the film forming gas pipe 26 and installed to pass through a low portion of a sidewall of the manifold 13. An opening/closing valve 27 and a flow rate controller 28 such as a mass flow controller are provided in the film forming gas pipe 26, thereby enabling supply of the film forming gas while controlling a flow rate of the film forming gas. As the film forming gas, a silane-based gas such as monosilane ($SiH_4$) gas, disilane ($Si_2H_6$) gas and the like may be used to form an amorphous silicon film, a germane-based gas such as monogermane ($GeH_4$) gas, digermane ($Ge_2H_6$) gas and the like may be used to form a germanium film, and a silane-based gas and a germane-based gas may be used to form a silicon germanium film.

The chlorine-containing compound gas supplying mechanism 22 has a chlorine-containing compound gas supplying source 29, a chlorine-containing compound gas pipe 30 for guiding a chlorine-containing compound gas from the chlorine-containing compound gas supplying source 29, and a chlorine-containing compound gas nozzle 30a connected to the chlorine-containing compound gas pipe 30 and installed to pass through the low portion of the sidewall of the manifold 13. An opening/closing valve 31 and a flow rate controller 32 such as a mass flow controller are provided in the chlorine-containing compound gas pipe 30, thereby enabling supply of the chlorine-containing compound gas under control of a flow rate thereof. The examples of the chlorine-containing compound gas may include a silicon-based chlorine-containing compound gas such as monochlorosilane (MCS; $SiH_3Cl$) gas, dichlorosilane (DCS; $SiH_2Cl_2$) gas, trichlorosilane (TCS; $SiHCl_3$) gas, silicontetrachloride (STC; $SiCl_4$) gas, hexachlorodisilane (HCD; $Si_2Cl_6$) gas and the like; or a germanium-based chlorine-containing compound gas such as monochlorogermane ($GeH_3Cl$) gas, dichlorogermane ($GeH_2Cl_2$) gas, trichlorogermane ($GeHCl_3$) gas, germaniumtetrachloride ($GeCl_4$) gas, hexachlorodigermane ($Ge_2Cl_6$) gas and the like.

The inert gas supplying mechanism 23 has an inert gas supplying source 33, an inert gas pipe 34 for guiding an inert gas from the inert gas supplying source 33, and an inert gas nozzle 34a connected to the inert gas pipe 34 and installed to pass through the low portion of the sidewall of the manifold 13. An opening/closing valve 35 and a flow rate controller 36 such as a mass flow controller are provided on the inert gas pipe 34. As the inert gas, a rare gas such as nitrogen ($N_2$) gas or argon (Ar) gas may be used.

In addition, an evacuation pipe 38 for discharging a process gas from a gap between the outer tube 11 and the inner tube 12 is connected to an upper portion of the sidewall of the manifold 13. This evacuation pipe 38 is connected to a vacuum pump 39 for evacuating the interior of the processing container 10, and a pressure regulation mechanism 40 including a pressure regulation valve and the like is provided on the evacuation pipe 38. While the interior of the processing container 10 is evacuated by the vacuum pump 39, the interior of the processing container 10 is adjusted to a predetermined pressure by the pressure regulation mechanism 40.

This film forming apparatus 1 has a control part 50. The control part 50 includes a computer (CPU) for controlling respective components of the film forming apparatus 1, for example, the valves, the mass flow controllers, a heater power source, a driving mechanism such as the elevation mechanism and the like; user interfaces consisting of a keyboard through which an operator performs an operation of inputting a command and the like to manage the film forming apparatus 1 and a display for visualizing and representing an operation status of the film forming apparatus 1; and a storage part in which parameters of various processing to be performed in the film forming apparatus 1 or programs, i.e., processing recipes, for executing the processing in the respective components of the film forming apparatus 1 depending on processing conditions are stored. As desired, any processing recipe is retrieved from the storage part in response to instructions from the user interface or the like and is executed by the computer. Accordingly, desired processing is performed in the film forming apparatus 1 under the control of the computer.

<Film Forming Method>

Next, a film forming method performed using the aforementioned film forming apparatus will be described. Here, a case where an amorphous silicon film is formed by using monosilane ($SiH_4$) gas as a raw material gas and dichlorosilane (DCS; $SiH_2Cl_2$) gas as a chlorine-containing compound gas will be described by way of example.

In the present embodiment, a wafer W in which an insulating film (SiO$_2$ film) 201 is formed on a silicon (Si) base 200 and in which a fine recess 202 is formed in a predetermined pattern on the insulating film 201 is prepared as a target substrate. The fine recess 202 is a hole such as a contact hole or a trench. The fine recess is a deep recess having a width (diameter) of 5 to 100 nm, a height of 20 to 10,000 nm and an aspect ratio of about 4 to 100. For example, the width or diameter is 100 nm, the height is 4,000 nm, and the aspect ratio is 40.

For example, 50 to 150 wafers W as described above are mounted on the wafer boat 20, and the interior of the processing container 10 of the film forming apparatus 1 is heated such that a temperature of a center portion (a central portion in a vertical direction) of the wafer boat 20 becomes a temperature suitable for forming a film, e.g., 470 to 550 degrees C. Then, the wafer boat 20 having the wafers W is mounted on the turntable 18 with the heat insulation tube 19 interposed therebetween, and the wafer boat 20 is loaded into the processing container 10 through the lower opening of the processing container 10 by raising the elevation unit 16.

Subsequently, after a pressure in the interior of the processing container 10 is adjusted to 0.1 to 5 Torr (13.3 to 665 Pa), monosilane (SiH$_4$) gas as the film forming gas is supplied into the processing container 10 (the inner tube 12) from the film forming gas supplying source 25 via the film forming gas pipe 26 at a predetermined flow rate, and dichlorosilane (SiH$_2$Cl$_2$) gas as the chlorine-containing compound gas is supplied into the processing container 10 (the inner tube 12) from the chlorine-containing compound gas supplying source 29 via the chlorine-containing compound gas pipe 30, so that an amorphous silicon film is formed at a temperature of 470 to 550 degrees C. while rotating the wafer boat 20.

Conventionally, the amorphous silicon film has been formed by a chemical vapor deposition method using only SiH$_4$ gas. However, when a recess portion such as a hole or a trench is filled, a gas pressure tends to be lowered from a surface of the recess portion to a bottom of the recess portion, and this tendency becomes remarkable when a deep hole or trench is filled. For this reason, when the amorphous silicon film is formed in a deep recess, a deposition rate is high in the vicinity of the surface of the recess since a reaction probability is high in the vicinity of the surface of the recess where a gas pressure is high, whereas the deposition rate is low at the bottom of the recess since the reaction probability is low at the bottom of the recess where the gas pressure is low. Accordingly, an amorphous silicon film 203 formed in the fine and deep recess 202 on the insulating layer 201 has a larger thickness at the surface of the recess and a smaller thickness at the bottom of the recess, thereby resulting in poor step coverage. Therefore, as the film formation proceeds in this manner, voids may be created in a portion of the amorphous silicon film that is embedded in the recess 202.

In contrast, in this example, by adding DCS gas, which is the chlorine-containing compound gas, to SiH$_4$ gas, which is the film forming gas, adsorption of SiH$_4$ gas at an upper portion of the recess 202 can be selectively inhibited while the film formation at the bottom of the recess 202 proceeds, so that a V-shaped amorphous silicon film, which is thick at the bottom of the recess 202 and thin at the upper portion of the recess, can be formed in the recess. Accordingly, creation of voids in the amorphous silicon film can be very effectively suppressed.

Hereinafter, the foregoing will be described in detail with reference to FIG. 4.

Figure 4:
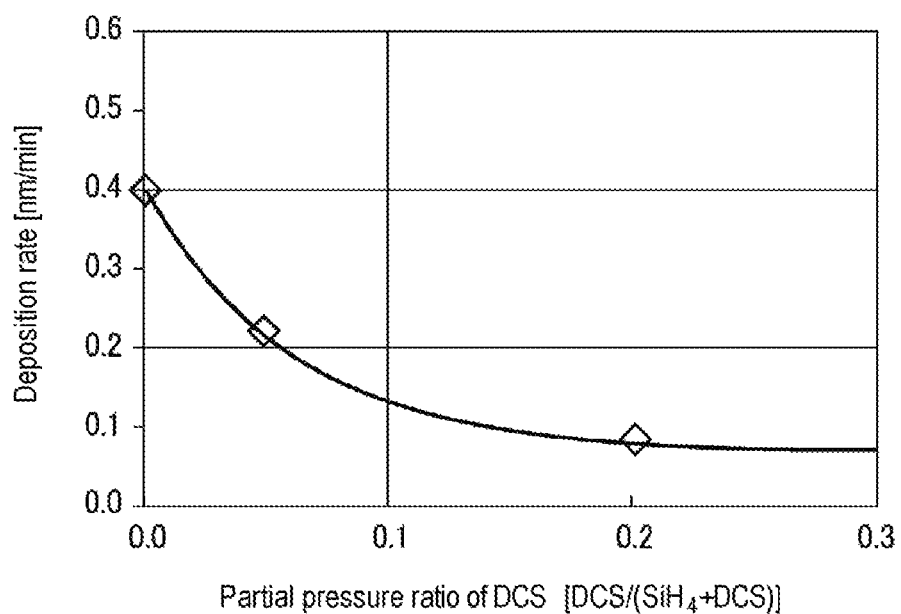
FIG. 4 is a view illustrating a relationship between a partial pressure ratio of dichloro silane (DCS) and a deposition rate when an amorphous silicon film is formed by adding DCS gas, which is a chlorine-containing compound gas, to $SiH_4$ gas that is a film forming gas.

FIG. 4 is a view illustrating a relationship between a deposition rate of a film and a partial pressure ratio (flow rate ratio) of DCS gas with respect to the sum of partial pressures (flow rates) of SiH$_4$ gas and DCS gas. A film forming temperature at this time was 510 degrees C. and a gas pressure (the sum of the pressures of SiH$_4$ gas and DCS gas) was 0.4 Torr.

As shown in FIG. 4, it can be found that when the partial pressure ratio of DCS gas was 0, i.e., when only SiH$_4$ gas was used, the film deposition rate was 0.4 nm/min, whereas the addition of DCS gas decreases the deposition rate and thus DCS gas has an adsorption inhibiting effect on SiH$_4$ gas. Since chlorine has high bonding energy with IV group elements, the addition of DCS gas as the chlorine-containing compound gas results in strong bonding of chlorine in molecules of DCS gas with silicon that is an element in the IV group, so that adsorption of SiH$_4$ gas (bonding of silicon and silicon) may be inhibited.

Furthermore, it can be seen from this figure that the deposition rate of the film rapidly increases at an area where the partial pressure of DCS gas is low. In other words, in the area where the partial pressure of DCS gas is low, the adsorption inhibiting effect on SiH$_4$ gas is small. Therefore, the adsorption inhibiting effect exhibited by DCS gas is drastically lowered at the bottom of the fine recess 202 where the gas partial pressure becomes low, and the adsorption inhibiting effect exhibited by DCS gas is selectively obtained at the upper portion of the fine recess 202.

As shown in FIG. 4, it is preferable that the partial pressure ratio (flow rate ratio) of DCS gas at the upper portion of the fine recess 202 is 0.01 or more which enables the adsorption inhibiting effect, but the partial pressure ratio at the bottom of the fine recess 202 needs to be in a range in which the adsorption inhibiting effect is lowered. If the partial pressure ratio (flow rate ratio) of DCS gas is too high when SiH$_4$ gas and DCS gas are supplied, there is a possibility that the adsorption of SiH$_4$ gas may be hindered even at the bottom of the fine recess 202. Therefore, it is preferable that the partial pressure ratio (flow rate ratio) of DCS gas is in a range of 0.01 to 0.2 when SiH$_4$ gas and DCS gas are supplied.

Actual film forming conditions may be, for example, the following:

The number of wafers: 150
Film forming temperature: 510 degrees C.
Pressure: 0.4 Torr (53.2 Pa)
Flow rate of SiH$_4$ gas: 500 sccm
Flow rate of DCS gas: 10 sccm
Partial pressure ratio (flow rate ratio) of DCS gas: 0.02

Figure 5:
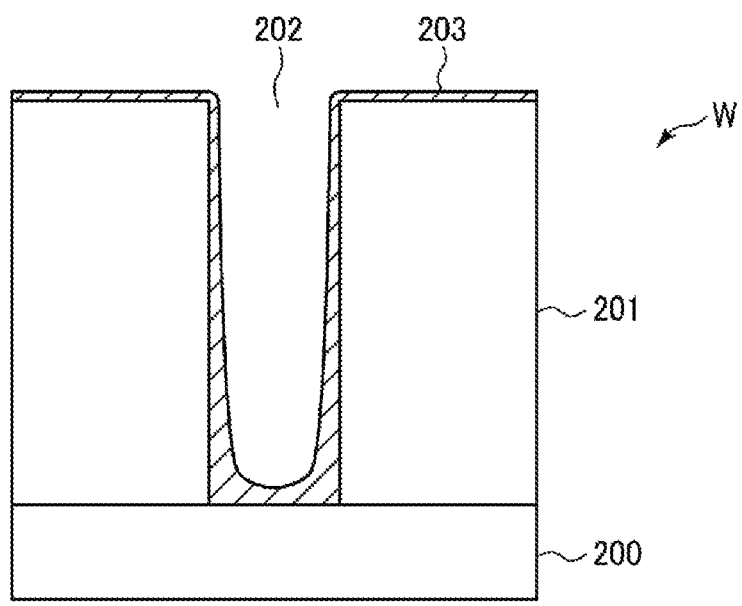
FIG. 5 is a sectional view illustrating a state of a film forming process in one example of the film forming method according to the present disclosure.

As such, in this example, SiH$_4$ gas as the film forming gas and DCS gas which is the chlorine-containing compound gas for inhibiting the adsorption of SiH$_4$ gas are supplied into the processing container 10 to form the amorphous silicon film while selectively inhibiting the adsorption of SiH$_4$ gas at the upper portion of the fine recess 202 in the wafer W. Therefore, in the middle of the film forming process, a V-shaped amorphous silicon film, which is thick at the bottom of the fine recess 202 and thin at the upper portion of the recess, is formed in the recess, as shown in FIG. 5.

Figure 6:
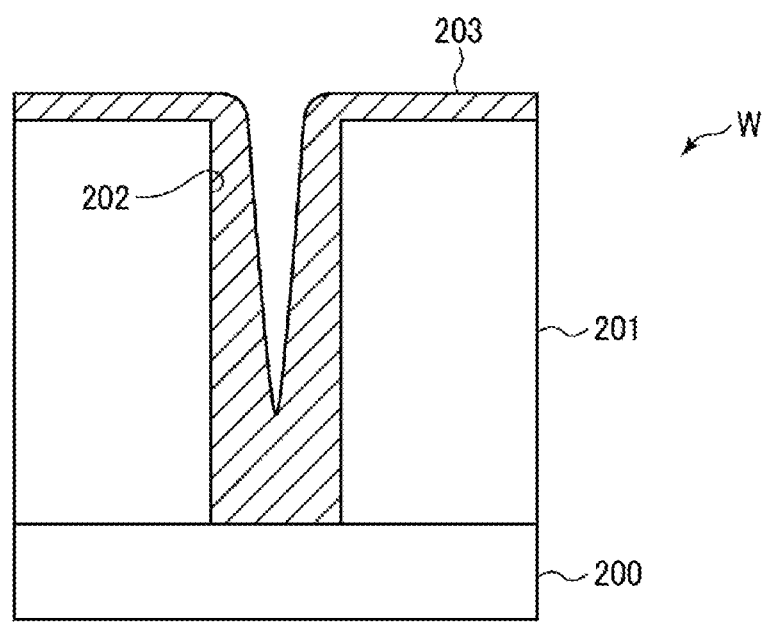
FIG. 6 is a sectional view illustrating a state of the film forming process in the example of the film forming method according to the present disclosure, showing a state where the film forming process further proceeds from the state of FIG. 5.
Figure 7:
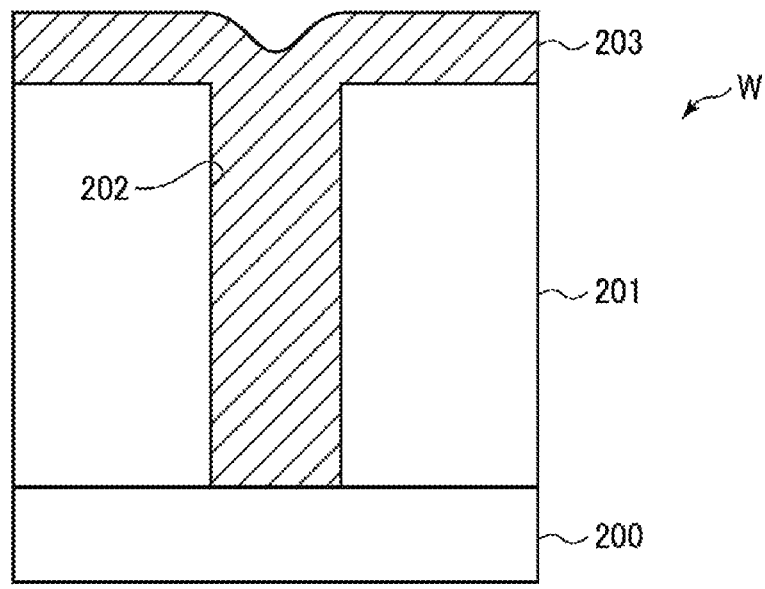
FIG. 7 is a sectional view illustrating a state of the film forming process in the example of a film forming method according to the present disclosure, showing a state where filling into a recess is completed.

Since it is possible to form the V-shaped film, when the film formation further proceeds, the amorphous silicon film 203 shows a bottom-up growth in the fine recess 202, so that an amorphous silicon film 203 is formed even at the upper portions of sidewalls of the fine recess 202 to such an extent that a width of the fine recess 202 is not narrowed as shown in FIG. 6. Finally, as shown in FIG. 7, the amorphous silicon film 203 having no void can be embedded in the recess 202.

With such a simple method of only adding the chlorine-containing compound gas such as DCS gas, the amorphous silicon film having no void can be formed in a fine recess having a high aspect ratio, without degrading the productivity or complicating the process.

After completion of the film formation, the supply of $SiH_4$ gas as the film forming gas and DCS gas as the chlorine-containing compound gas is stopped, the interior of the processing container 10 is evacuated by the vacuum pump 39 via the evacuation pipe 38, and the inert gas is supplied from the inert gas supplying source 33 through the inert gas pipe 34 into the processing container 10 (the inner tube 12) to purge the interior of the processing container 10. Then, after the interior of the processing container 10 is returned to an atmospheric pressure, the elevation unit 16 is lowered to unload the wafer boat 20.

Although the example in which the amorphous silicon film is formed using $SiH_4$ gas as the film forming gas has been described above, another silane-base gas such as $Si_2H_6$ gas or the like may be employed as the film forming gas for the amorphous silicon film as described above. When the amorphous silicon film is formed using $Si_2H_6$ gas, the film forming temperature is preferably in a range of 390 to 410 degrees C.

In addition, the film formation using the adsorption inhibiting effect exhibited by the chlorine-containing compound as described above can be applied to formation of a germanium film or a silicon germanium film in addition to the silicon film such as the amorphous silicon film. In case of forming a germanium film, a germane-based gas such as $GeH_4$ gas, $Ge_2H_6$ gas or the like may be employed and the film forming temperature is preferably in a range of 250 to 300 degrees C. In case of forming a silicon germanium film, a silane-based gas such as $SiH_4$ gas, $Si_2H_6$ gas or the like and a germane-based gas such as $GeH_4$ gas, $Ge_2H_6$ gas or the like may be employed and the film forming temperature is preferably in a range of 250 to 450 degrees C.

In any of these cases, DCS gas is preferable as the chlorine-containing compound gas for inhibiting adsorption of the film forming gas. However, as described above, another silicon-based chlorine-containing compound gas such as MCS ($SiH_3Cl$) gas, TCS ($SiHCl_3$) gas, STC ($SiCl_4$) gas, HCD ($Si_2Cl_6$) gas or the like may be employed or a germanium-based chlorine-containing compound gas such as $GeH_3Cl$ gas, $GeH_2Cl_2$ gas, $GeHCl_3$ gas, $GeCl_4$ gas, $Ge_2Cl_6$ gas or the like may be utilized. Since the chlorine-containing compound gases have bonding between IV group elements and chlorine in the molecules, these gases have a high effect of inhibiting adsorption of the film forming gas.

<Other Applications>

Although the embodiments of the present disclosure have been described above, the present disclosure is not limited to these embodiments and can be variously modified without departing from the scope and spirit of the present disclosure.

For example, although the embodiments have been described in connection with the example in which the method of the present disclosure is performed by a vertical batch type apparatus, the present disclosure is not limited to the example but may be performed by various other film forming apparatuses such as a horizontal batch type apparatus, a single wafer processing apparatus or the like.

Moreover, although the silicon-based chlorine-containing compound gas and the germanium-based chlorine-containing compound gas are described as the chlorine-containing compound gas for inhibiting adsorption of the film forming gas, other chlorine-containing compound gases other than those gases may also be employed.

According to the present disclosure, when a silicon film, a germanium film, or a silicon germanium film is formed by the CVD method on a target substrate having a fine recess formed on a surface thereof, a film forming gas containing an element constituting the film to be formed and a chlorine-containing compound gas are supplied into the processing container and adsorption of the film forming gas at an upper portion of the fine recess is selectively inhibited by the chlorine-containing compound gas. As a result, it is possible to proceed with formation of a V-shaped film which is thick at a bottom of the fine recess and thin at the upper portion of the fine recess, so that it is possible to allow a film having no void or seam to be embedded in the recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon film, a germanium film or a silicon germanium film on a target substrate having a fine recess formed on a surface of the target substrate by a chemical vapor deposition method, the method comprising:
    placing the target substrate having the fine recess in a processing container; and
    supplying a film forming gas containing an element constituting a film to be formed and a chlorine-containing compound gas into the processing container;
    wherein, in supplying a film forming gas, a partial pressure ratio of the chlorine-containing compound gas with respect to the sum of partial pressures of the film forming gas and the chlorine-containing compound gas is 0.01 or more and 0.3 or less.

2. The method of claim 1, wherein the film forming gas is at least one of a silane-based gas and a germane-based gas.

3. The method of claim 2, wherein the silane-based gas is $SiH_4$ gas or $Si_2H_6$ gas and the germane-based gas is $GeH_4$ gas or $Ge_2H_6$ gas.

4. The method of claim 1, wherein the chlorine-containing compound gas is a silicon-based chlorine-containing compound gas or a germanium-based chlorine-containing compound gas.

5. The method of claim 4, wherein the silicon-based chlorine-containing compound gas is one of $SiH_3Cl$ gas, $SiH_2Cl_2$ gas, $SiHCl_3$ gas, $SiCl_4$ gas and $Si_2Cl_6$ gas, and the germanium-based chlorine-containing compound gas is one of $GeH_3Cl$ gas, $GeH_2Cl_2$ gas, $GeHCl_3$ gas, $GeCl_4$ gas and $Ge_2Cl_6$ gas.

6. The method of claim 1, wherein a partial pressure ratio of the chlorine-containing compound gas with respect to the sum of partial pressures of the film forming gas and the chlorine-containing compound gas is 0.01 to 0.2.

7. A method of forming a silicon film on a target substrate having a fine recess formed on a surface of the target substrate by a chemical vapor deposition method, the method comprising:
    placing the target substrate having the fine recess in a processing container; and supplying $SiH_4$ gas as a film forming gas and $SiH_2Cl_2$ gas for inhibiting adsorption of $SiH_4$ gas into the processing container;

wherein, in supplying $SiH_4$ gas, a partial pressure ratio of $SiH_2Cl_2$ gas with respect to the sum of partial pressures of $SiH_4$ gas and $SiH_2Cl_2$ gas is 0.01 or more and 0.3 or less.

8. The method of claim 7, wherein a partial pressure ratio of $SiH_2Cl_2$ gas with respect to the sum of partial pressures of $SiH_4$ gas and $SiH_2Cl_2$ gas is 0.01 to 0.2.

* * * * *